United States Patent
Johnson et al.

(10) Patent No.: US 8,592,293 B2
(45) Date of Patent: Nov. 26, 2013

(54) SCHOTTKY BARRIER DIODES FOR MILLIMETER WAVE SIGE BICMOS APPLICATIONS

(75) Inventors: Jeffrey B. Johnson, Essex Junction, VT (US); Xuefeng Liu, South Burlington, VT (US); Bradley A. Orner, Fairfax, VT (US); Robert M. Rassel, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 164 days.

(21) Appl. No.: 13/028,673

(22) Filed: Feb. 16, 2011

(65) Prior Publication Data
US 2011/0143494 A1    Jun. 16, 2011

Related U.S. Application Data (62) Division of application No. 11/853,973, filed on Sep. 12, 2007, now Pat. No. 7,936,041.

(60) Provisional application No. 60/844,649, filed on Sep. 15, 2006.

(51) Int. Cl.
*H01L 21/28* (2006.01)

(52) U.S. Cl.
USPC ............... 438/570; 438/571; 257/E21.359

(58) Field of Classification Search
USPC .......... 438/570, 571, 205, 237; 257/E21.359, 257/E27.04
See application file for complete search history.

(56) References Cited

U.S. PATENT DOCUMENTS

| | | | |
|---|---|---|---|
| 4,005,469 A | 1/1977 | Chang et al. | |
| 4,159,915 A | 7/1979 | Anantha et al. | |
| 4,228,448 A | 10/1980 | Lalumia et al. | |
| 4,644,383 A | 2/1987 | Akcasu | |
| 4,679,251 A | 7/1987 | Chown | |
| 4,859,616 A | 8/1989 | Losehand et al. | |
| 5,405,797 A | 4/1995 | Brugger | |
| 5,422,501 A | 6/1995 | Bayraktaroglu | |
| 5,455,187 A | 10/1995 | Richards et al. | |
| 5,605,851 A | 2/1997 | Palmieri et al. | |
| 5,680,073 A | 10/1997 | Nathan et al. | |
| 6,011,297 A | 1/2000 | Rynne | |
| 6,049,108 A | 4/2000 | Williams et al. | |
| 6,365,447 B1 | 4/2002 | Hebert et al. | |
| 6,414,371 B1 | 7/2002 | Freeman et al. | |

(Continued)

OTHER PUBLICATIONS

Office Action dated Feb. 6, 2009 in U.S. Appl. No. 11/941,452.

(Continued)

*Primary Examiner* — Matthew Landau
*Assistant Examiner* — Candice Y Chan
(74) *Attorney, Agent, or Firm* — Anthony Canale; Roberts Mlotkowski Safran & Cole, P.C.

(57) ABSTRACT

A method for forming a Schottky barrier diode on a SiGe BiCMOS wafer, including forming a structure which provides a cutoff frequency ($F_c$) above about 1.0 THz. In embodiments, the structure which provides a cutoff frequency ($F_c$) above about 1.0 THz may include an anode having an anode area which provides a cutoff frequency ($F_c$) above about 1.0 THz, an n-epitaxial layer having a thickness which provides a cutoff frequency ($F_c$) above about 1.0 THz, a p-type guardring at an energy and dosage which provides a cutoff frequency ($F_c$) above about 1.0 THz, the p-type guardring having a dimension which provides a cutoff frequency ($F_c$) above about 1.0 THz, and a well tailor with an n-type dopant which provides a cutoff frequency ($F_c$) above about 1.0 THz.

17 Claims, 13 Drawing Sheets

(56) References Cited

U.S. PATENT DOCUMENTS

| | | |
|---|---|---|
| 6,489,660 B1 | 12/2002 | Einthoven et al. |
| 6,656,815 B2 | 12/2003 | Coolbaugh et al. |
| 6,891,251 B2 | 5/2005 | Coolbaugh et al. |
| 6,927,452 B2 | 8/2005 | Shin et al. |
| 7,001,806 B2 | 2/2006 | Tilke et al. |
| 7,029,965 B2 | 4/2006 | Yoshida |
| 7,180,157 B2 | 2/2007 | Freeman et al. |
| 7,202,514 B2 | 4/2007 | Ahmed et al. |
| 7,242,071 B1 | 7/2007 | Liu et al. |
| 7,329,940 B2 | 2/2008 | Coolbaugh et al. |
| 2001/0042867 A1 | 11/2001 | Furuhata |
| 2002/0084506 A1 | 7/2002 | Voldman et al. |
| 2002/0096725 A1 | 7/2002 | Yoshihisa |
| 2002/0173092 A1 | 11/2002 | Yamaguchi et al. |
| 2003/0094673 A1 | 5/2003 | Dunn et al. |
| 2003/0116782 A1 | 6/2003 | Mizutani |
| 2004/0036115 A1 | 2/2004 | Disney |
| 2004/0227210 A1 | 11/2004 | Tilke et al. |
| 2005/0207077 A1 | 9/2005 | Xu et al. |
| 2005/0269664 A1 | 12/2005 | Ahlgren et al. |
| 2006/0043454 A1 | 3/2006 | Coolbaugh et al. |
| 2007/0096257 A1 | 5/2007 | Coolbaugh et al. |

OTHER PUBLICATIONS

Goins, E. W., "Semiconductor structure with high and low voltage section", IBM technical disclosure bulletin, vol. 25, No. 6, pp. 3103-3104, Nov. 1982.

Abrosimov et al. J. Crystal Growth 1997, 174, 182.

Sankaran et al. "Schottky Barrier Diodes for Millimeter Wave Detection in a Foundry CMOS Process", Jul. 2005, IEEE Electron Device Letters, vol. 26, No. 7, pp. 492-494.

Dunn et al. "SiGe BiCMOS Trends—Today and Tomorrow", Sep. 10-13, 2006, IEEE Custom Integrated Circuits Conference, pp. 695-702.

Ser. No. 11/853,973 filed on Sep. 12, 2007, which claims priority to U.S. Provisional Application No. 60/844,649 filed on Sep. 15, 2006, the disclosures of which are expressly incorporated by reference herein in their entirety.

SCHOTTKY BARRIER DIODES FOR MILLIMETER WAVE SIGE BICMOS APPLICATIONS

CROSS-REFERENCE TO RELATED APPLICATIONS

The present application is a divisional of U.S. application Ser. No. 11/853,973 filed on Sep. 12, 2007, which claims priority to U.S. Provisional Application No. 60/844,649 filed on Sep. 15, 2006, the disclosures of which are expressly incorporated by reference herein in their entirety.

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of contract No. N-6601-02-C-8011 awarded by the Defense Advanced Research Projects Agency (DARPA).

FIELD OF THE INVENTION

The invention relates generally to a semiconductor structure and method of manufacturing, and more particularly to an on-chip Schottky barrier diode working at millimeter wave frequency range and a method of manufacture using a single or dual epitaxial process.

BACKGROUND OF THE INVENTION

There is an increasing demand for integrated circuits to operate at millimeter wave (mm Wave) frequencies. Silicon germanium (SiGe) bipolar complementary metal oxide semiconductor (BiCMOS) technology is a natural choice for such an application due to its high performance bipolar transistor integrated with high quality passives and CMOS devices. SiGe heterojunction bipolar transistors (HBTs) have shown steady improvement with a recent report of 300/350 Ghz $f_T/f_{max}$, which enables various mm Wave applications. However, for a technology to be mm Wave capable one must look beyond the high speed transistors and evaluate the passive components such as Schottky barrier diodes (SBDs), PIN diodes, and varactor diodes.

An SBD with a cutoff frequency ($F_c$) above a terahertz enables designs such as mixers, high speed sample and hold circuits at mm Wave frequencies. In other applications, the SBD is used as a rectifier in power detectors for power amplification circuits. Low leakages in the off state translate to superior hold times in sample and hold circuits. For a power detector, low leakage is necessary due to noise constraints.

Additionally, high frequency applications, such as millimeter wave devices (f>30 GHz), require multifunction circuits with different types of devices for optimum operation. For example, in advanced microwave devices, transmitter circuits of communication and radar systems use heterojunction bipolar transistors (HBTs). But, in this same device, receiver circuits comprise field effect transistors (FETs), such as high electron mobility transistors (HEMTs), to minimize the noise figure and therefore improve the receiver sensitivity. The performance of such multifunction circuit devices can be reduced if all of the subsystem functions can be accomplished with the use of a common device process technique to integrate all of the relevant advanced devices onto the same substrate.

Prior generation SBDs have utilized implanted subcollectors and shallow and deep buried subcollectors. An SBD with an implanted subcollector, while exhibiting good leakage characteristics (i.e., low leakage), suffers from a low $F_c$. Further, an SBD with a shallow subcollector suffers from both a low $F_c$, due in part to a high capacitance, and a high amount of leakage. Additionally, an SBD with a deep subcollector exhibits a low leakage and a high $F_c$. However, a deep subcollector detrimentally impacts the performance of the high speed transistors, e.g., HBTs. Thus, manufacturing an SBD and a transistor on the same wafer using a single subcollector for both the SBD and the transistors may prevent optimization of both devices.

Accordingly, there exists a need in the art to overcome the deficiencies and limitations described hereinabove.

SUMMARY OF THE INVENTION

In a first aspect of the invention, a method is provided for forming a Schottky barrier diode (SBD) on a SiGe BiCMOS wafer. The method includes forming a structure which provides a cutoff frequency ($F_c$) above about 1.0 THz.

In a second aspect of the invention, a method is provided for forming a first collector in a substrate, the first collector comprising a Schottky barrier diode (SBD) with a cutoff frequency ($F_c$) above about 1.0 THz. The method additionally includes, forming a first epitaxial layer on the substrate. The method additionally includes, forming a second collector in the first epitaxial layer, the second collector comprising a high performance NPN device. The method additionally includes, forming a first conducting channel in the first epitaxial layer. The method additionally includes, forming a second epitaxial layer on the first epitaxial layer over the first collector and the second collector.

DESCRIPTION OF EMBODIMENTS OF THE INVENTION

The invention relates to a semiconductor structure and method of manufacturing. In one embodiment, the invention relates to a structure and method of manufacturing an SBD for SiGe BiCMOS mm Wave applications. In a further embodiment, the invention relates to a structure and method of combining a very high breakdown device, e.g., an SBD device, and a very high performance NPN (e.g., bipolar) device on a wafer without compromising the performance of either device, i.e., to optimize both devices. In one embodiment, the method of fabrication uses a dual epitaxial process for on-chip Schottky barrier diodes working at millimeter wave range; although other devices such as, for example, high breakdown NPN HBT, varactors, passives, PIN diodes are also contemplated for use with the invention.

By implementing the invention, using the same wafer, a high performance NPN can be fabricated with a thin collector and a high breakdown voltage device can be fabricated with a thick film collector. Additionally, in the invention, a second subcollector can be used as a reach through of the high breakdown device to contact the subcollector to the surface. The system and method of the invention is fully compatible to the existing BiCMOS technologies.

According to the invention, in order to expand SBD performance in a SiGe BiCMOS mm Wave application, the $F_c$ of the SBD may be increased and the leakage of the SBD may be reduced. More specifically, the cutoff frequency, $F_c=1/(2\pi RC)$, may be increased to greater than 1 terahertz. The cutoff frequency ($F_c$) may be increased in order to expand passive device performance, and more specifically to expand SBD performance, in SiGe BICMOS mm Wave applications. The $F_c$ of an SBD device is dependent upon the parasitic resistances and the parasitic capacitances of the device.

Figure 1:
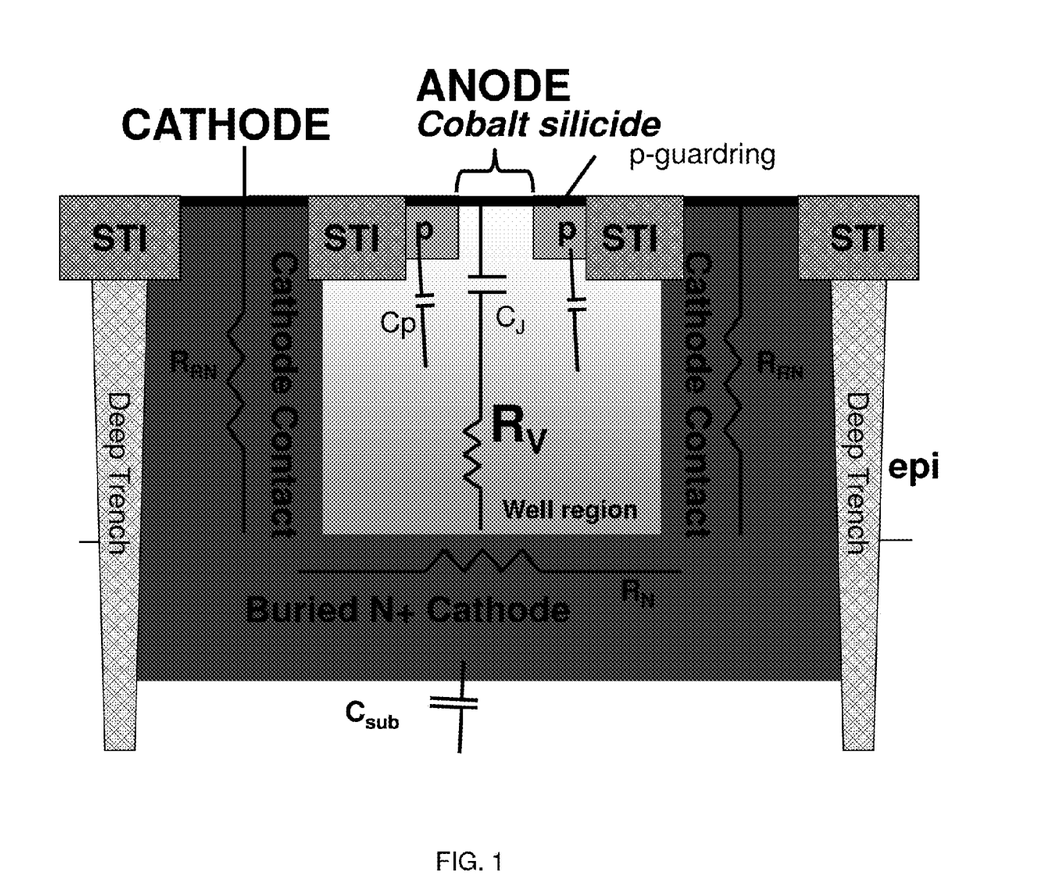
FIG. 1 shows a cross-sectional view of an SBD according to an aspect of the invention.

FIG. 1 shows an SBD according to an aspect of the invention. As represented in FIG. 1, parasitic resistance, which decreases $F_c$, include down resistance in intrinsic region $R_V$, buried layer lateral resistance $R_N$, reach through resistance $R_{RN}$, and contact and wiring resistances. Moreover, the intrinsic region resistance $R_V$ dominates the resistive parasitic. Additionally, the parasitic capacitance occurs between the device and substrate $C_{sub}$, p-guardring and the buried layer $C_P$, and between the anode and the cathode $C_J$. The anode-to-cathode capacitance sources include the capacitance down to the buried layer, the capacitance between the anode and the reach through implants, and capacitances between the anode and cathode wiring.

In order to increase the $F_c$ of the SBD device, resistance and capacitance of the device may be minimized. According to an aspect of the invention, capacitance of the device may be minimized by scaling the device sizes (particularly the anode size), optimizing the cathode depth (n-epi layer thickness) and optimization of the P-type guardring. According to a further aspect of the invention, resistance of the device may be minimized, utilizing a low resistance buried cathode, by optimizing the dopant concentration of the well tailor.

Layout Optimization—Anode Size

Figure 2:
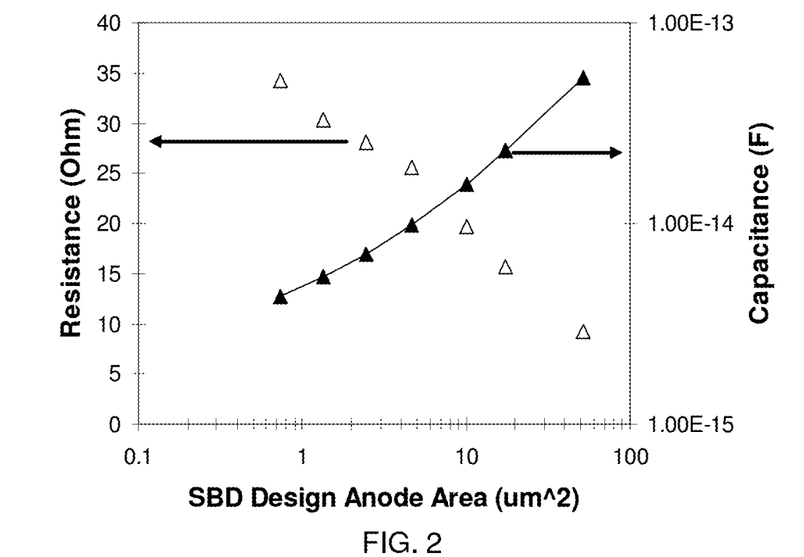
FIG. 2 shows a graphical representation of the effect of an anode size of an SBD on resistance and capacitance of the SBD, according to an aspect of the invention.

FIG. 2 shows the effects of decreasing the SBD anode size. As shown in FIG. 2, as the anode size decreases, the resistance of the SBD increases. However, as further shown in FIG. 2, decreasing the anode size also decreases the capacitance of the SBD.

Figure 3:
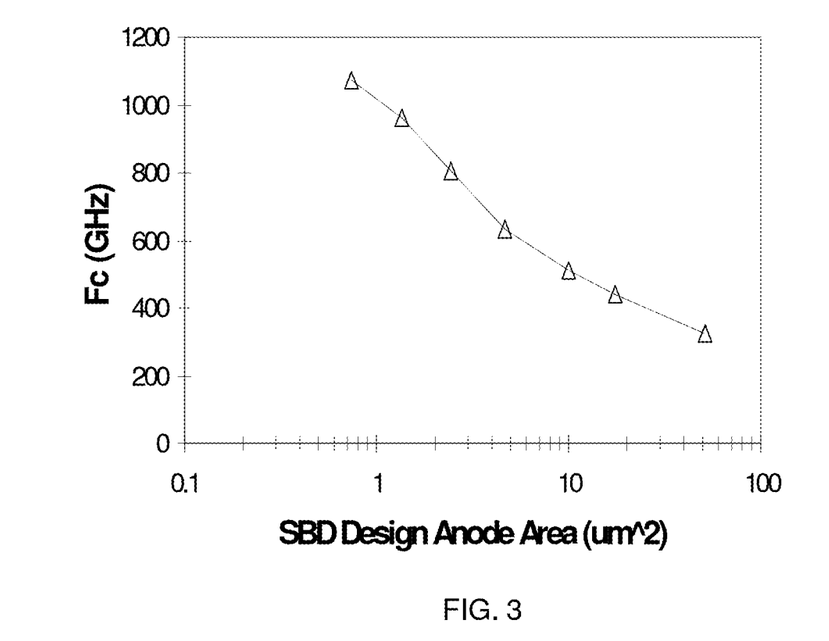
FIG. 3 shows a graphical representation of the effect of the anode size of the SBD on the cut-off frequency ($F_c$) of the SBD, according to an aspect of the invention.

Additionally, as shown in FIG. 3, the $F_c$ of the SBD increases as anode size decreases with a $F_c$ reaching about 1.1 THz for a moderately sized dimension of about 1.1 $\mu m^2$. Thus, while decreasing the anode size may cause an increase in the resistance, which may indicate a decrease in $F_c$, FIG. 3 shows that the overall effect of decreasing the anode size of the SBD is an increased $F_c$ of the SBD. In other words, the resulting decrease in capacitance from a decrease in anode size outweighs the increase in resistance as they impact the $F_c$.

Figure 4:
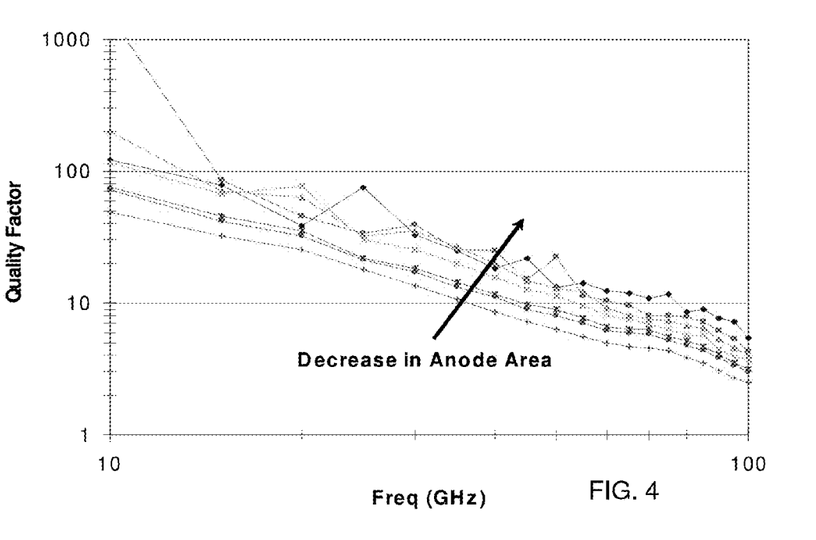
FIG. 4 shows a graphical representation of the effect of anode size of an SBD on the quality factor (Q) of the SBD, according to an aspect of the invention.

FIG. 4 shows the quality factors (Q) across frequencies from 10 to 100 GHz for various anode sizes. As shown in FIG. 4, a decrease in anode size increases the Q to greater than 100 at a frequency of 10 GHz and to about 11 at a frequency of 70 GHz. Thus, higher Q and $F_c$ of the SBD are achievable by scaling the device, and particularly the anode size, more aggressively. Additionally, according to an aspect of the invention, anode sizes as small as 0.10 $\mu m^2$, which are achievable using advance lithography, may further improve the device performance.

Process Optimization—N-Epitaxial Thickness

Additionally, according to an aspect of the invention, the distance of the buried n+ layer cathode from the surface, or the thickness of the n-epitaxial (n-epi) layer, has been determined to be a strong lever for performance optimization of an SBD. By optimizing the n-epi thickness, mm Wave SBDs may be attainable in SiGe BICMOS devices. As described further below, decreasing the n-epi thickness reduces the vertical resistance. Furthermore, increasing the n-epi thickness reduces the capacitance for the P-N+ diode.

Figure 5:
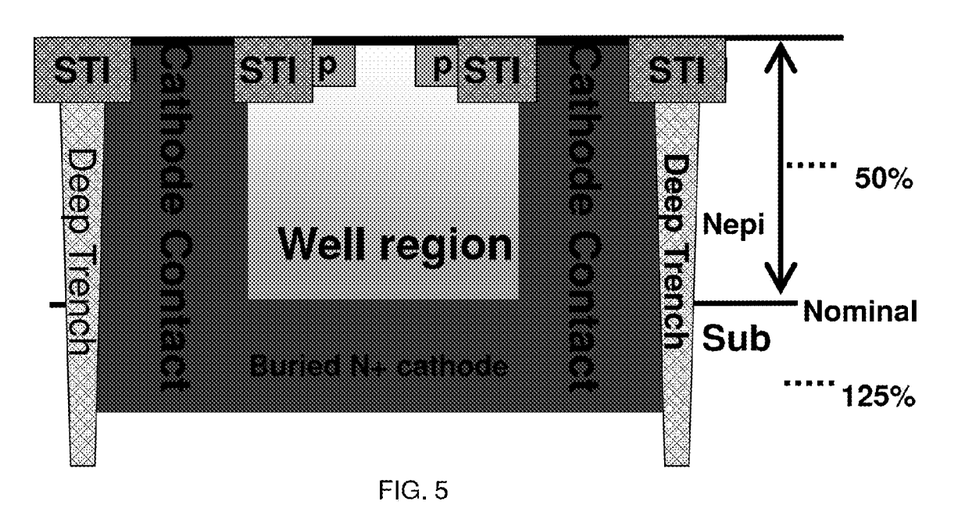
FIG. 5 shows a view of an SBD, according to an aspect of the invention.

FIG. 5 shows an SBD according to an aspect of the invention. More specifically, FIG. 5 shows an SBD having an n-epi layer of nominal thickness of around 2 microns. Additionally, FIG. 5 represents an n-epi layer of 50% of nominal thickness and an n-epi layer of 125% of nominal thickness.

Figure 6:
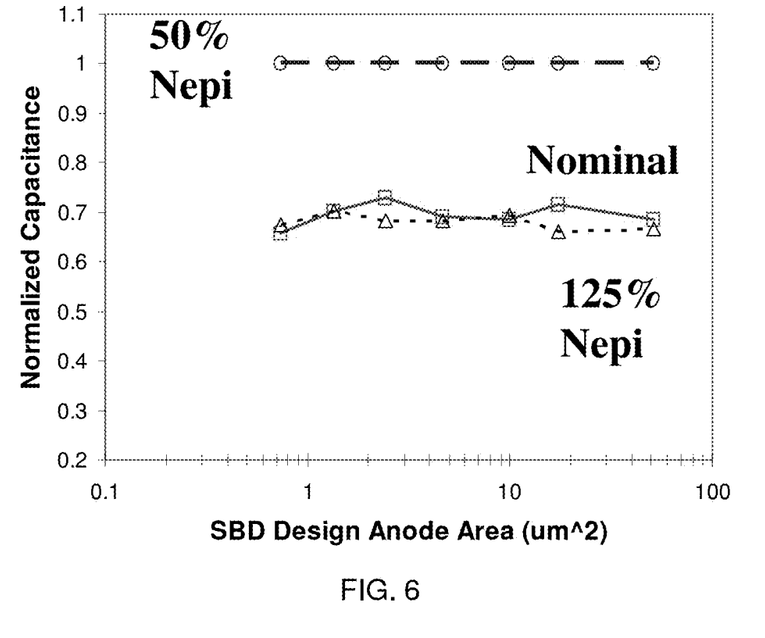
FIG. 6 shows a graphical representation of the effect of a buried cathode depth, or n-epitaxial layer thickness, of the SBD on the resistance of the SBD, according to an aspect of the invention.

FIG. 6 shows a graphical analysis of the n-epi thickness on the capacitance of the SBD. As shown in FIG. 6, according to an aspect of the invention, decreasing the n-epi thickness from the nominal n-epi thickness to the 50% of nominal thickness increases the capacitance. Further, as shown in FIG. 6, increasing the n-epi thickness from the nominal thickness to the 125% of nominal thickness does not significantly affect the capacitance.

Figure 7:
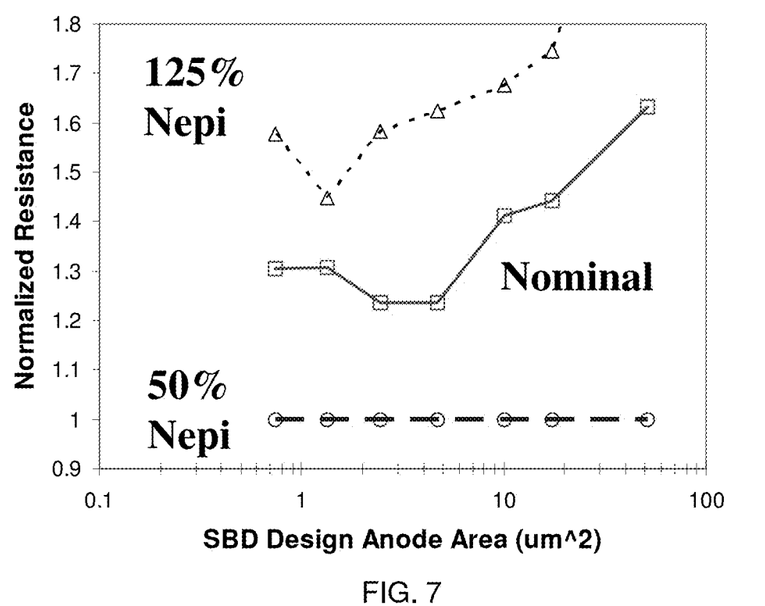
FIG. 7 shows a graphical representation of the effect of the buried cathode depth, or n-epitaxial layer thickness, of the SBD on the capacitance of the SBD, according to an aspect of the invention.

FIG. 7 shows a graphical analysis of the n-epi thickness on the resistance of the SBD. As shown in FIG. 7, according to an aspect of the invention, decreasing the n-epi thickness from a nominal n-epi thickness to the 50% of nominal thickness decreases the resistance. Further, as shown in FIG. 7, increasing the n-epi thickness from the nominal thickness to the 125% of nominal thickness increases the resistance. Thus, according to an aspect of the invention, it may be advantageous to optimize the n-epi thickness of the SBD to increase the $F_c$.

Additionally, according to an aspect of the invention, an SBD may be provided on a single wafer along with an NPN (bipolar device) and provided with its own cathode at a depth (or with a thickness of the n-epi layer) tuned or optimized for the SBD. With this embodiment, according to an aspect of the invention, it may be advantageous to provide a thin film collector (or near collector) for high performance NPN (bipolar) device and a thick film collector (or far collector) for high breakdown voltage devices, e.g., an SBD and PIN diode.

Moreover, a thick film collector, or a collector having a thicker n-epi layer, may be provided, which is optimized for the SBD and PIN diode. Thus, according to this aspect of the invention, the growth of all structures on a same wafer is possible without compromising the performance of any of the devices.

Process Optimization—P-Type Guardring Formation

Additionally, according to an aspect of the invention, optimization of the p-type guardring may decrease the capacitance and leakage, and therefore increase the $F_c$. The p-type guardring is typically formed from the standard PFET source/drain ion implantation, and defines the Schottky junction area. The Schottky barrier is formed by cobalt salicidation of n-silicon. Effectively, the p-type guardring and the Schottky junction are shorted together by silicide.

Figure 8:
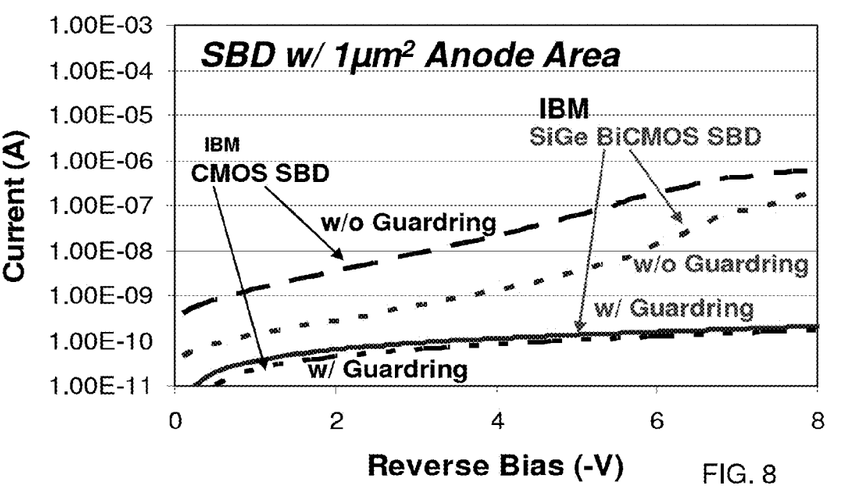
FIG. 8 shows a graphical representation of the effect of the dosage of a well tailor of an SBD on the $F_c$ of the SBD, according to an aspect of the invention.

FIG. 8 shows a graphical analysis of the p-type guardring effect on leakage. More specifically, FIG. 8 shows a graphical analysis of the reverse bias versus the current of SBDs with and without a p-type guardring. As shown in FIG. 8, the p-type guardring provides for reliable operation of the SBD. More specifically, the p-type guardring decreases leakage by manipulating the current downward and away from the shallow trench isolations (STIs) and edge of the silicide, as the current follows the path of least resistance.

Figure 9:
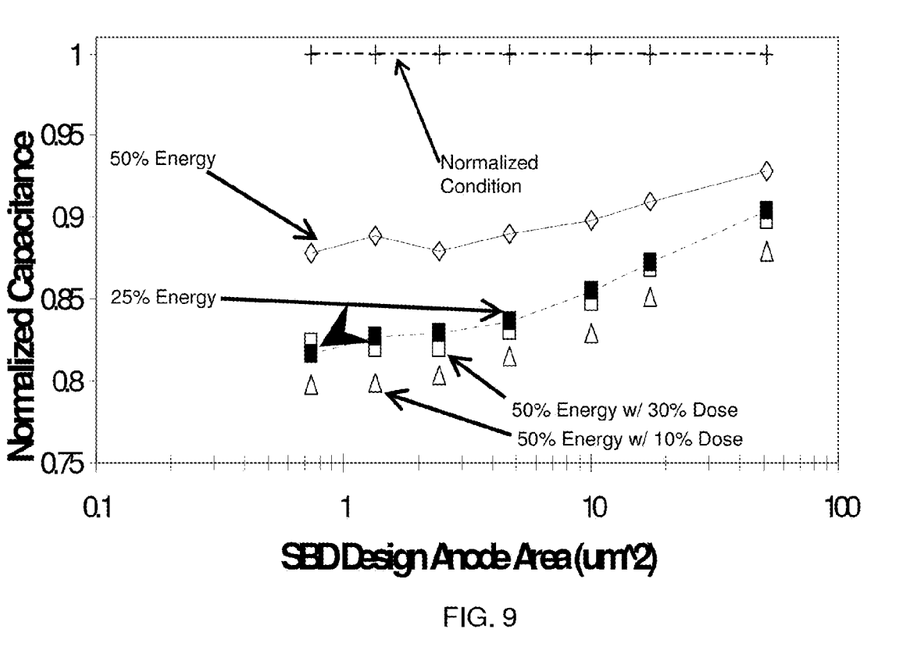
FIG. 9 shows a graphical representation of an SBD p-type guardring effect upon the leakage of the SBD, according to an aspect of the invention.

FIG. 9 shows a graphical analysis of a p-type guardring ion implantation dose and energy reduction. The energy of the ion implantation forming the p-type guardring determines the P to N+ distance. Additionally, the dose of the ion implantation forming the p-type guardring has a strong effect on the PN diode. Moreover, both the energy and the dosage effect the parasitic capacitance of the device.

As is shown in FIG. 9, by ion implanting the p-type guardring at lower energies (50% and 25%), as compared to the normalized process condition, a reduction in capacitance may be observed. The normalized process condition has an ion implant energy of about 30 keV. Additionally, ion implanting at a lower energy (50%) and lower dosages (30% and 10%), e.g., dose range from 1e18 cm$^{-3}$-1e19 cm$^{-3}$, as compared to the normalized process condition, e.g., 1e21 cm$^{-3}$, a further reduction in the capacitance may be observed. As explained above, the reduction in capacitance will result in an increased $F_c$ of the SBD. Additionally, as shown in FIG. 9, the reduction of the energy and dosage of the ion implantation forming the p-type guardring has a negligible effect on the DC characteristics of the device.

Additionally, according to an aspect of the invention, the p-type guardring may be scaled down. More specifically, the p-type guardring may be scaled down as small as is achievable with a photo resist, e.g., about 0.1-0.2 microns.

Process Optimization—Well Tailor

Figure 10:
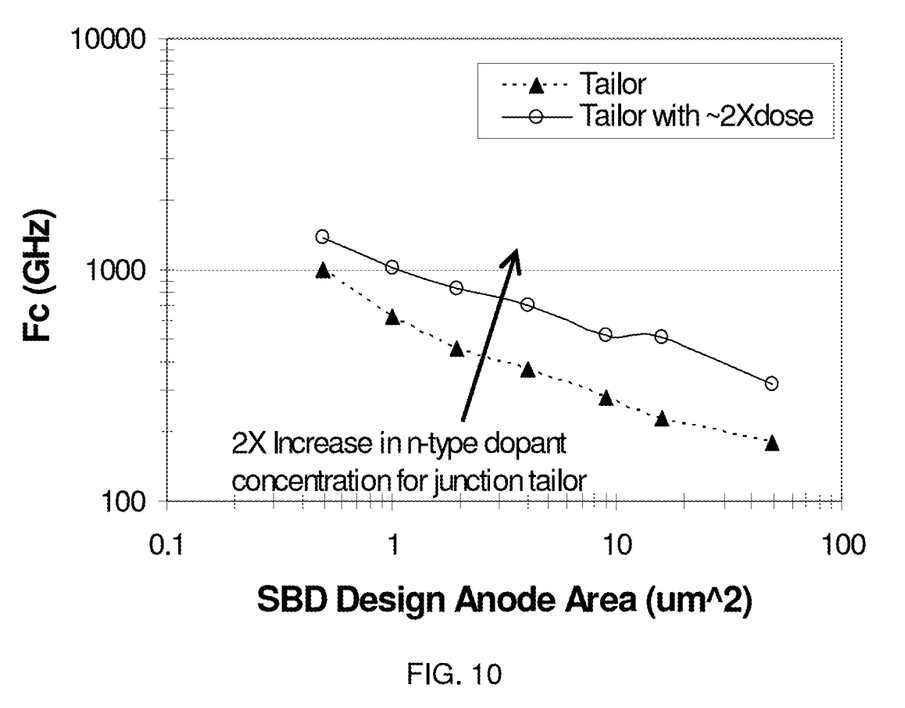
FIG. 10 shows a graphical representation of the effect of an SBD guardring implant dose and energy on the capacitance of the SBD, according to an aspect of the invention.

With an SBD, an additional n-type implant (n-well or well tailor) is used to lower the vertical column resistance, or the resistance from the junction down to the buried n+ layer. Moreover, the n-type implant eliminates the intrinsic region required for the mm Wave PiN diode that also relies on the thick film collector, or a collector having a thicker n-epi layer. According to an aspect of the invention, optimizing the dopant concentration of the n-type implant to tailor the dopant profile between the Schottky junction and the buried n+ layer may minimize the resistance, and thus increase the $F_c$ of the SBD. FIG. 10 shows a graphical analysis of the effect of the well tailor dosage on the $F_c$. As shown in FIG. 10, a doubling of the total n-type ion implant dosage from a standard PFET N Well (around $5 \times 10^{13}$ atoms/cm$^2$), as well as implementing a deeper retrograded ion implant profile for this well tailor, increases the $F_c$.

Device Formation Process

FIGS. 11-23 show steps for the formation of a dual epitaxial SBD and heterojunction bipolar transistor (HBT) device on the same wafer, according to an embodiment of the invention. As should be understood, according to an aspect of the invention, an SBD may be formed on a wafer without a NPN (bipolar device), e.g., an HBT, in which case a single epitaxial layer approximating the combined thickness of the two epitaxial layers of the below-described dual epi process may be sufficient.

Figure 11:
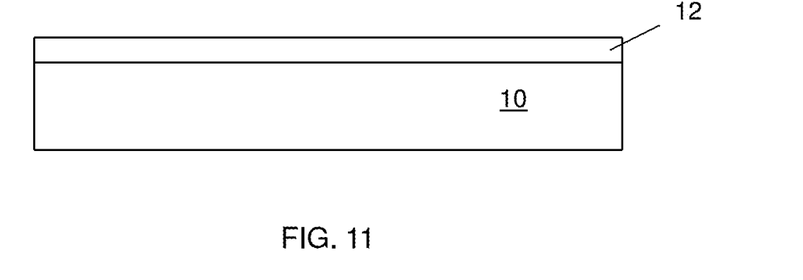
FIGS. 11-23 show process steps for forming a final structure shown in FIG. 13, in accordance with an aspect of the invention.

Referring to FIG. 11, a starting structure is shown, which includes a pad oxide 12 formed on a substrate 10. In one embodiment, the substrate may be silicon, although other materials may equally be used such as, for example, SOI. Although not critical to the understanding of the invention, the substrate 10 may be approximately 700 um thick, with other thickness also contemplated by the invention. The pad oxide 12 may have a thickness of between 50 Å and 150 Å; although, other thickness are also contemplated by the invention. The pad oxide layer 12 may be formed by conventional deposition or growing processes.

Figure 12:
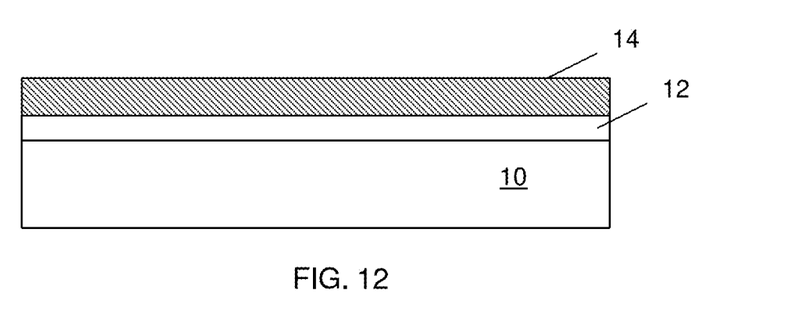
Figure 13:
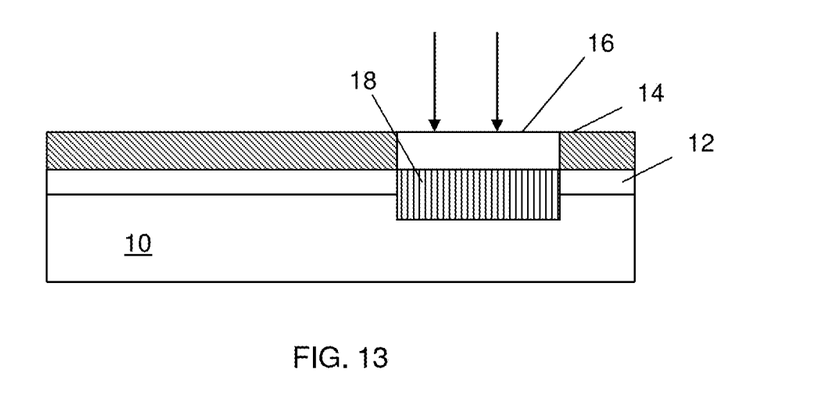

In FIG. 12, a photoresist 14 is formed over the pad oxide 12. In FIG. 13, the photoresist 14 is exposed in order to open a window 16 to the underlying layer(s). The formation of the window 16 is formed in a well-known semiconductor photoresist process such as, using spin on glass techniques. As such, a description of the photoresist process is not necessary for a person of ordinary skill in the art to practice this particular step.

In FIG. 13, after a window 16 is opened in the photoresist 12, the method of fabrication continues by doping, e.g., ion implanting, the exposed underlying layer(s) with well-known dopants. In one illustrative embodiment, the dopant element for a collector may include, for example, arsenic (As) or antimony (Sb). In one implementation, doping occurs at a common energy level and dosage, for example, in the energy range of approximately 20-60 KeV and dose of $1E^{15}$ to $5E^{16}$. The ion implantation process may be used to form a subcollector 18, e.g., deep N+, extending into the underlying layer(s).

Figure 14:
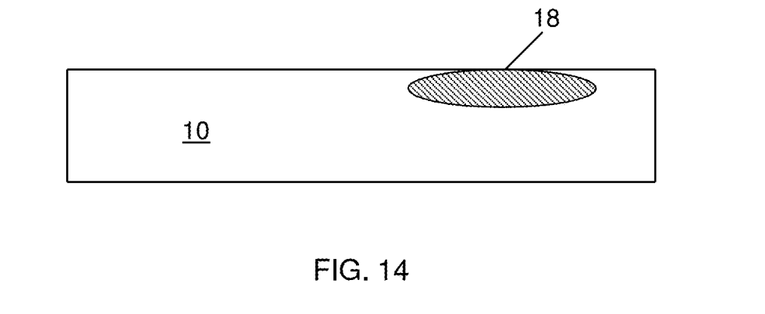

Referring to FIG. 14, the photoresist layer 12 is stripped using conventional processes. In this processing step, the pad oxide 12 may also be stripped, e.g., etched, using conventional processes. In one embodiment, the stripping process removes any implant damage that occurred during the doping process described above.

Figure 15:
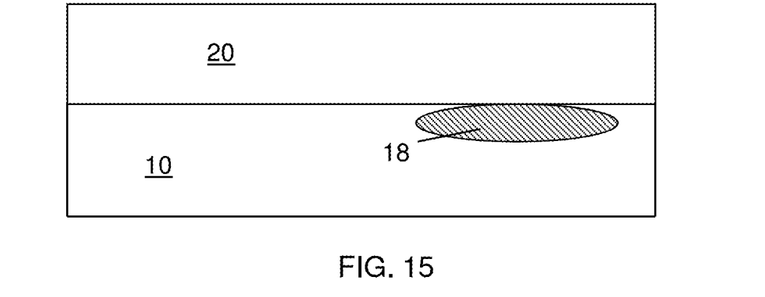
Figure 16:
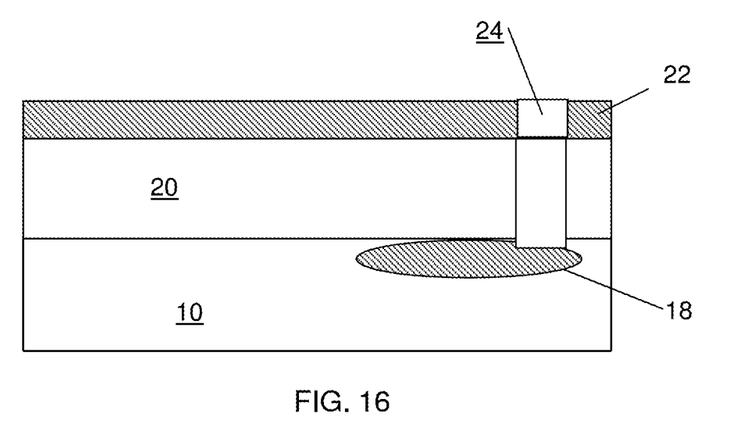

In FIG. 15, an epitaxial (epi) layer 20 is formed over the substrate 10 and, in FIG. 16, a photoresist layer 22 is formed over the epi layer 20. In one embodiment, a pad oxide layer may be formed over the epi layer 20, prior to the formation of the photoresist layer 22. In a conventional fabrication process, the photoresist layer 22 is exposed to light to open window 24.

Figure 17:
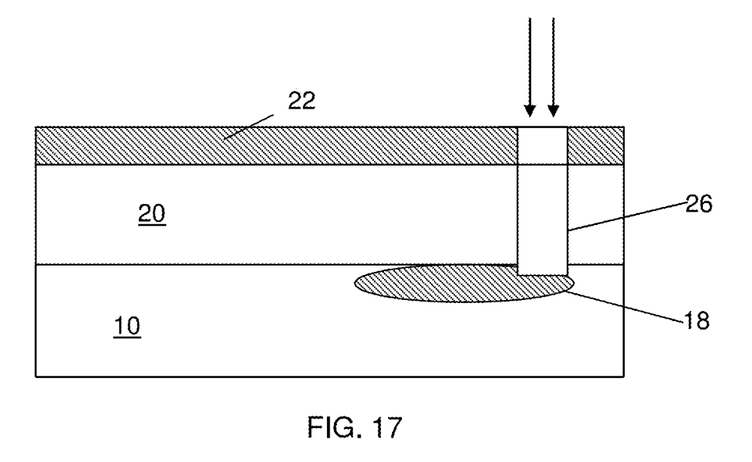

In FIG. 17, an ion implantation process is performed using dopants such as, for example, phosphorous, arsenic or antimony to form the reach through as shown in region 26. The reach through works as a conducting channel to link the far side subcollector 18 to the surface. The far side subcollector 18 may form a Schottky Barrier diode cathode or PIN diode cathode or high breakdown NPN HBT subcollector in the final structures, for example. The photoresist layer 22 (and, in embodiments, the pad oxide layer) may then be stripped using conventional processes. Any damage from the ion implanting process may be repaired during this stripping process.

Figure 18:
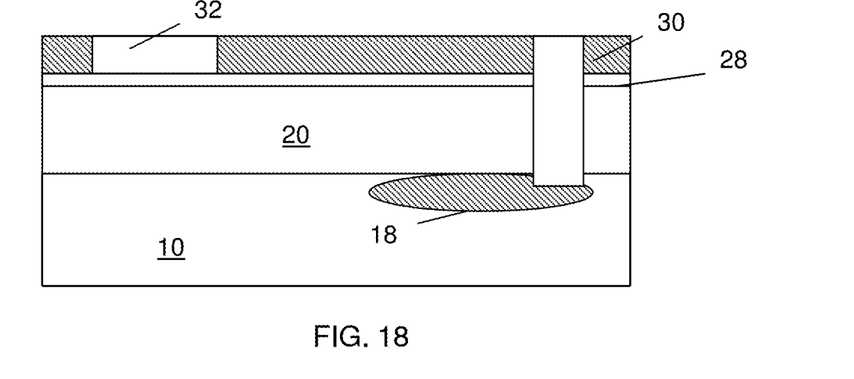

In FIG. 18, a pad oxide layer 28 and another photoresist layer 30 are formed over the epi layer 20, in any conventional manner. For example, as with the previous steps, the pad oxide layer 28 may be thermally grown or deposited. In conventional semiconductor processing steps, a window 32 is opened in the photoresist layer 30, remote from the subcollector 18.

Figure 19:
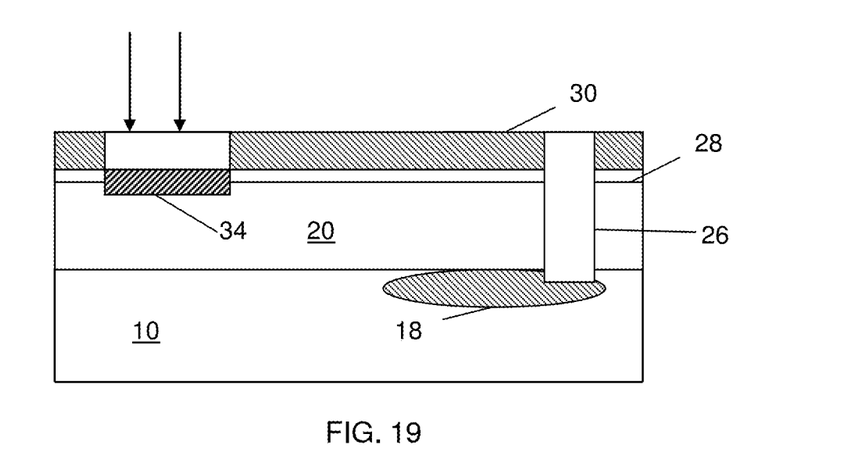

In FIG. 19, a conventional ion implantation process is performed using dopants such as, for example, phosphorous, arsenic or antimony. This dopant process forms a collector 34 within the epi layer 20. The photoresist layer 30 is stripped using a conventional process, pad oxide 28 will be stripped of thereafter. In one embodiment, this stripping process removes any implant damage that occurred during the doping process described above.

Figure 20:
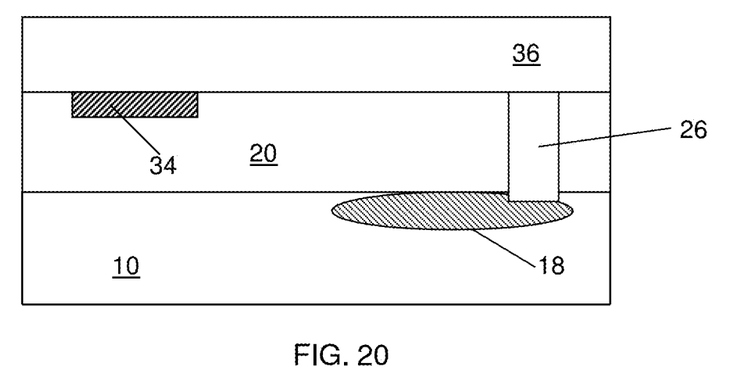

In FIG. 20, a second epi layer 36 is formed over the structure. In particular, the epi layer 36 is formed over the collector 34 and epi layer 20. The second epi layer 36 is preferably of a different thickness than the epi layer 20. Both first and second epitaxial layers can be fabricated to have a wide thickness flexibility to provide tunability of the devices. In an embodiment of the invention, the epi layer 36 is approximately 0.4 um and more preferably may range from 0.3 um to 1 um, which is less than the thickness of the epi layer 20, which normally may range from 1-3 um. In any scenario, the second epi layer 36 can be formed at any thickness to tune the device, thus providing advantages over known fabrication methods.

By fabricating a second epi layer 36, which can be of a desired thickness, a thin film collector for high performance NPN devices and a thick film collector for high breakdown voltage devices can be fabricated on a single wafer. By having a thin film collector and a thick film collector, performance of both the high performance NPN devices and the high breakdown voltage devices can be optimized.

Figure 21:
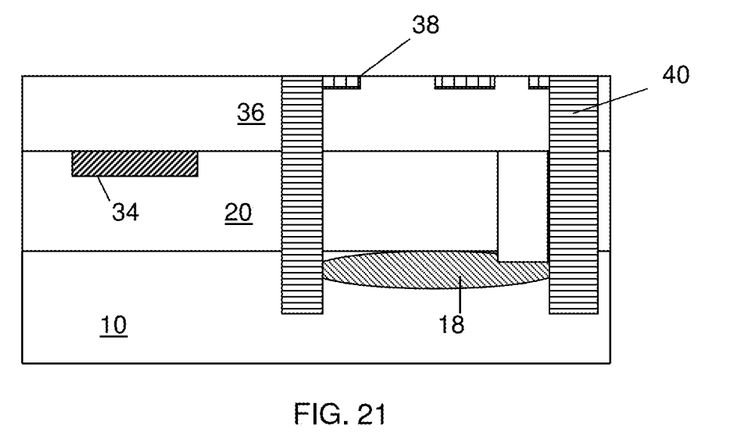

In FIG. 21, shallow trench isolation structures 38 and deep trench isolation structures 40 are formed in conventional processes. The shallow trench isolation structures 38 and deep trench isolation structures 40 are formed for device isolation purposes. Alternatively, isolation structures may comprise local oxidation of silicon ("LOCOS") structures. In embodiments, the reach through 26, deep trench isolation structures 40 and far subcollector 18 are electrically connected.

Figure 22:
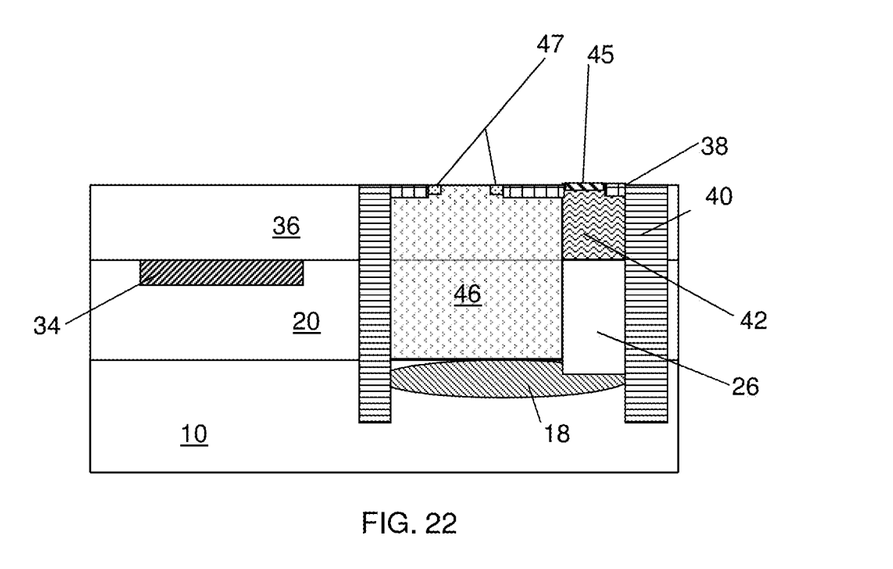

In FIG. 22, a second reach through 42 is formed in the second epi layer 36. The second reach through 42 works as a conducting channel to link the collector 34 or the first reach through 26 to the surface for contact. The second reach through 42 is formed by ion implantation with species such as phosphorous, arsenic and antimony. The reach through implant energy ranges from 50-100 KeV and dose ranges from 1e15 to 5e16, respectively. The second reach through 42 for linking the first reach through should be aligned properly to eliminate any misalignment caused high conducting resistance. In addition, as shown in FIG. 22, the n-type well tailor region 46 is formed by a deep retrograded ion implant process and provides a lower resistance path between the surface of the substrate where the Schottky junction will be formed and for subcollector 18, which is utilized as the buried cathode of the SBD.

Additionally, as shown in FIG. 22, a p-type guardring 47 is formed by ion implantation. A nitride film may also be formed after the p-type guardring formation to protect the HBT, SBD, etc. from being attacked by FET processing, as should be known to those of skill in the art. The nitride film may be stripped when contact is made. Additionally, as shown in FIG. 22, an n+ layer 45 may be formed over the second reach through 42 above the first reach through 26. Moreover, the n+ layer, as well as the reach through may be formed using as much dopant as possible to form a highly doped n+ region.

Figure 23:
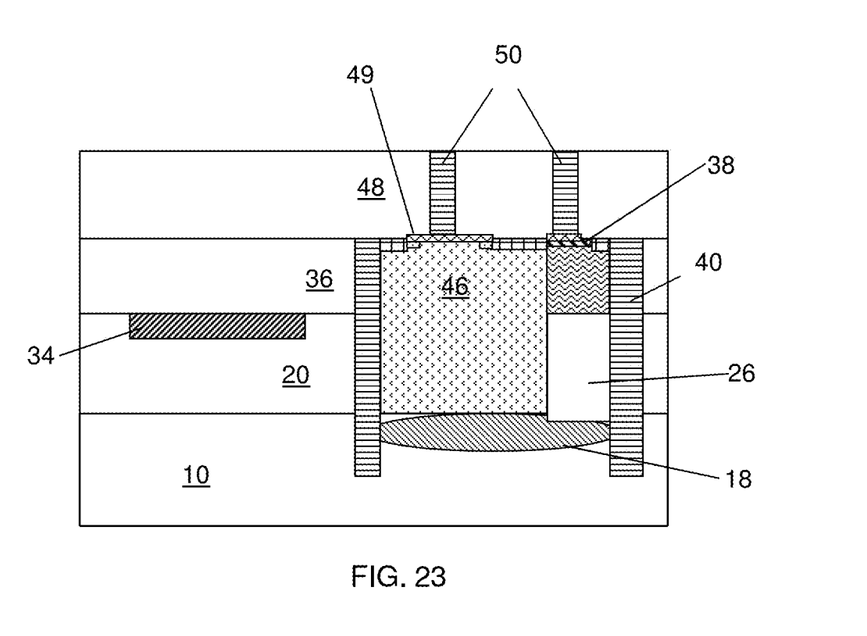

The remaining process steps required to complete the integrated circuit involve such steps as forming passive components, forming interconnect metallization, etc. which are performed as is well known in the art. For example, as shown in FIG. 23, a self-aligned silicide 49 may be formed. Additionally, an interlevel dielectric layer 48, preferably comprising BPSG, is deposited over the surface of the wafer with a CVD process. In embodiments, the interlevel dielectric 48 is deposited to electrically insulate the device from a subsequently deposited, overlying metal layer. Tungsten contacts 50 are formed in the interlevel dielectric layer 48, in a conventional manner, connecting to the anode and the reach through 42. The tungsten contacts 50 contacting to the silicided reach through form a N+ terminal of the device and the tungsten contacts 50 contacting to the self-aligned silicide 49, which contacts the p-type guardring and effectively the anode of the device.

In the embodiment of FIG. 23, the far side subcollector 18 portion of the device may used to form an SBD. Additionally, in further embodiments, the high breakdown voltage device may include NPN HBT transistor, PIN diodes, varactors, passives, and the like. The near side collector 34 side of the structure, on the other hand, may be used to form a high performance NPN device formed on a thinner collector layer than the high breakdown voltage device, thus optimizing the performance of both devices. While not shown, an additional reach thru may be formed for connection to the near side collector 34 in a similar manner to the formation of the reach thru 42.

While, the exemplary embodiment of FIG. 23 is shown with a single connection via reach throughs 42 and 26 to the buried subcollector 18 and the exemplary embodiment of FIGS. 1 and 5, is shown with two reach throughs (cathode contacts), one of ordinary skill in the art will recognize that these are equivalent structures. Moreover, as understood by one of ordinary skill in the art, the embodiment of FIGS. 1 and 5 is a ring structure, wherein the cathode contact is formed as an annular ring wrapping around the well region and Schottky junction when viewed from above. Thus, as readily understood by one of ordinary skill in the art, while the SBD cross-sectional views of FIGS. 1 and 5 show two reach throughs (cathode contacts), the two reach throughs are different portions of the same wrap around reach thru.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of embodiments, those of skill in the art will recognize that the invention can be practiced with modifications and in the spirit and scope of the appended claims.

The invention claimed is:

1. A method of forming a Schottky barrier diode (SBD) on a SiGe BiCMOS wafer, comprising:
   forming a first collector at a first depth in a substrate of the wafer, wherein the first collector is comprised by the SBD with a cutoff frequency ($F_c$) above about 1.0 THz;
   forming a first epitaxial layer on the substrate;
   forming a first conducting channel in the first epitaxial layer;
   forming a second collector at a second depth in the first epitaxial layer, wherein the first depth is different from the second depth and the second collector is comprised by a high performance NPN device;
   forming a second epitaxial layer on the first epitaxial layer over the first collector and the second collector;
   forming a second conducting channel in the second epitaxial layer; and
   forming a well tailor region in the first epitaxial layer and the second epitaxial layer over the first collector.

2. The method of claim 1, wherein the SBD comprises at least one of:
   an anode having an anode area which provides a cutoff frequency ($F_C$) above about 1.0 THz;
   an n-epitaxial layer having a thickness which provides a cutoff frequency ($F_C$) above about 1.0 THz;
   a p-type guardring at an energy and dosage which provides a cutoff frequency ($F_C$) above about 1.0 THz;
   the p-type guardring having a dimension which provides a cutoff frequency ($F_C$) above about 1.0 THz; and
   the well tailor region with an n-type dopant which provides a cutoff frequency ($F_C$) above about 1.0 THz.

3. The method of claim 2, wherein the anode is formed with an anode area of about 1.1 $\mu m^2$.

4. The method of claim 2, wherein the p-type guardring is formed by ion implanting at a lower energy and dosage than a normalized process condition.

5. The method of claim 2, wherein the p-type guardring is formed having a dimension between about 0.1 microns and 0.2 microns.

6. The method of claim 2, wherein the well tailor region is formed with an n-type dopant at about twice a normalized PFET n-type well dosage of about $5 \times 10^{13}$ atoms/cm$^2$.

7. A method comprising:
   forming a first collector in a substrate at a first depth, the first collector comprising a Schottky barrier diode (SBD) with a cutoff frequency ($F_c$) above about 1.0 THz;
   forming a first epitaxial layer on the substrate;
   forming a second collector in the first epitaxial layer at a second depth different from the first depth, the second collector comprising a high performance NPN device;
   forming a first conducting channel in the first epitaxial layer;
   forming a second epitaxial layer on the first epitaxial layer over the first collector and the second collector;
   forming a second conducting channel in the second epitaxial layer; and
   forming a well tailor region in the first epitaxial layer and the second epitaxial layer over the first collector.

8. The method of claim 7, wherein the first epitaxial layer has a thickness different from that of the second epitaxial layer.

9. The method of claim 8, wherein the first epitaxial layer is 1-3 $\mu$m in thickness and the second epitaxial layer is 0.3-1 $\mu$m in thickness.

10. The method of claim 7, wherein the well tailor region is formed by a dose of an n-type implant at about twice a normalized PFET n-type well implant dose.

11. The method of claim 10, wherein the normalized PFET n-type well implant dose is about $5 \times 10^{13}$ atoms/cm$^2$.

12. The method of claim 7, further comprising forming an anode over the well tailor region.

13. The method of claim 7, further comprising:
   forming a shallow trench isolation structure in the second epitaxial layer; and
   forming a deep trench isolation structure in the substrate, the first epitaxial layer, and the second epitaxial layer.

14. The method of claim 13, wherein the first collector, the first conducting channel, and the second conducting channel are electrically connected.

15. The method of claim 14, wherein the second conducting channel extends through the second epitaxial layer and electrically connects to the first conducting channel.

16. The method of claim 7, further comprising forming a p-type guardring in the second epitaxial layer.

17. The method of claim 16, wherein the p-type guardring has a dimension between 0.1 microns and 0.2 microns and is implanted at a lower energy and dosage as compared to a normalization process condition.

* * * * *